United States Patent [19]

Konian et al.

[11] 4,289,978
[45] Sep. 15, 1981

[54] COMPLEMENTARY TRANSISTOR INVERTING EMITTER FOLLOWER CIRCUIT

[75] Inventors: Richard R. Konian, Poughkeepsie; James L. Walsh, Hyde Park, both of N.Y.

[73] Assignee: International Business Machines Corp., Armonk, N.Y.

[21] Appl. No.: 82,255

[22] Filed: Oct. 5, 1979

[51] Int. Cl.³ .................... H03K 19/40; H03K 19/36
[52] U.S. Cl. .................................. 307/270; 307/255; 307/317 A; 307/455
[58] Field of Search .................. 307/270, 317 A, 255, 307/246, 215, 45

[56] References Cited

U.S. PATENT DOCUMENTS

| | | | |
|---|---|---|---|
| 3,433,978 | 3/1969 | Bongenaar et al. | 307/214 |
| 3,458,719 | 7/1969 | Weiss | 307/203 |
| 3,509,363 | 4/1970 | Jen et al. | 307/203 |
| 3,614,467 | 10/1971 | Tu | 307/214 |
| 3,798,471 | 3/1974 | Williams et al. | 307/270 |
| 3,854,057 | 12/1974 | Williams et al. | 307/270 |
| 3,987,310 | 10/1976 | Peltier et al. | 307/215 |
| 4,006,365 | 2/1977 | Marzin et al. | 307/214 |
| 4,045,689 | 8/1977 | Tietz | 307/270 |
| 4,053,792 | 10/1977 | Cannistra et al. | 307/246 |
| 4,064,405 | 12/1977 | Cricchi et al. | 307/214 |
| 4,065,678 | 12/1977 | Reese et al. | 307/270 |

OTHER PUBLICATIONS

"Nonsaturating Low Source Impedance, Complimentary Driver", P. D. Bellamy et al., IBM Tech. Disclosure Bulletin, vol. 10, No. 5, 10/67, pp. 672-673.
"T²L Compatible Push-Pull Drivers", W. B. Chin, IBM Tech. Disclosure Bulletin, vol. 14, No. 8, 1/72, p. 2289.

Primary Examiner—Stanley D. Miller, Jr.
Assistant Examiner—B. P. Davis
Attorney, Agent, or Firm—Robert J. Haase

[57] ABSTRACT

A complementary bipolar transistor circuit characterized by low power dissipation and fast response for driving capacitive loads in response to input logic signals. An emitter follower series-connected pair of complementary transistors provide an output signal at the junction between their commonly connected emitters. The NPN transistor of the pair of transistors is directly driven by an input signal applied to its base. The PNP transistor of the pair of transistors is driven through a second series-connected NPN transistor and Schottky diode, the second NPN transistor base also receiving said input signal. The forward voltage of the Schottky diode is less than the $V_{be}$ of the PNP transistor. The PNP transistor nominally is held off and conducts only on negative-going input signal transitions to discharge the capacitive load. The NPN transistor of the pair of transitors conducts only on positive-going input signal transitions to charge the capacitive load. The circuit can be extended to perform NOR logic and to provide a pair of output signals in phase opposition to each other.

7 Claims, 1 Drawing Figure

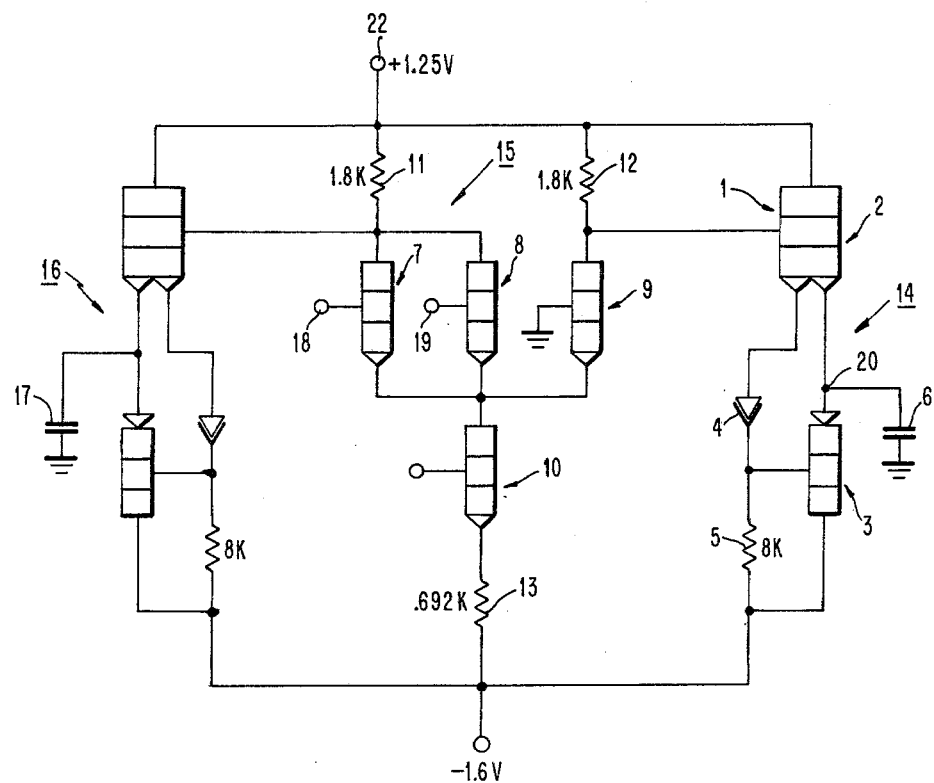

COMPLEMENTARY TRANSISTOR INVERTING EMITTER FOLLOWER CIRCUIT

BACKGROUND OF THE INVENTION

1. Field of the Invention

The invention generally relates to emitter follower circuits utilizing complementary bipolar transistors and, more particularly, to such circuits characterized by low power consumption and high speed in responding to input signal transitions of either increasing or decreasing sense.

2. DESCRIPTION OF THE PRIOR ART

As is well known, a capacitively loaded emitter follower circuit using complementary transistors such as shown, for example, in FIGS. 8-36 on page 304 of the text *Pulse, Digital and Switching Waveforms*, by J. Millman and H. Taub, McGraw Hill, 1965, provides an output waveform having rising edges and falling edges that follow (with comparable speed) the corresponding rising and falling edges of the input waveform. In the example given, however, the bases of the series-connected complementary transistors are driven by the same input waveform whose voltage excursions turn each transistor on and off. This necessitates a relatively large input voltage excursion, at least equal to the sum of the $V_{be}$'s for forward biasing the emitter-base junctions of the two transistors, and represents a significant power expenditure.

It is desirable that a way be found to actuate the complementary emitter follower circuit using voltage excursions which are only a fraction of the sum of the two $V_{be}$ voltages so that power dissipation, especially within large scale integrated circuits, may be minimized. It is also desirable that such actuation be achieved without compromising the response speed of the circuit.

One technique for actuating the complementary emitter follower circuit in the desired manner is disclosed in copending patent application Ser. No. 082,254, filed 10/5/79 for Complementary Transistor Inverting Emitter Follower Circuit, in the names of J. R. Cavaliere et al and assigned to the present assignee. In that copending application, the two complementary transistors of the emitter follower circuit are driven by a second pair of complementary transistors which includes a high performance PNP transistor. Although the technology exists to fabricate high performance PNP transistors in the same chip with NPN transistors, such technology is relatively complicated and expensive. It is sometimes advantageous to sacrifice some of the speed of the circuit disclosed in the cited patent application, where the intended use of the circuit permits, in order to avoid the need for high performance PNP technology. Such is the case with the present invention where the high performance PNP is eliminated while retaining most of the high speed and low power dissipation advantages of the circuit disclosed in the cited patent application relative to the other prior art complementary transistor emitter follower circuits.

SUMMARY OF THE INVENTION

A pair of complementary bipolar transistors connected in emitter follower configuration is driven by a second NPN transistor in series circuit with a Schottky diode. The Schottky diode connects the emitter of the second NPN transistor to the base of the PNP transistor of the complementary transistor pair. The bases of the second NPN transistor and of the NPN transistor of the complementary transistor pair are coupled to the same input terminal. The emitters of the complementary transistor pair are coupled to the same capacitively loaded output terminal. The capacitive load is charged through the NPN transistor of the complementary transistor pair when both NPN transistors are rendered conductive by the positive-going transition of the input signal applied to the input terminal. The forward conduction voltage drop of the Schottky diode is less than $V_{be}$ of the PNP transistor of the complementary transistor pair so that the PNP transistor nominally is held off (when the second NPN transistor conducts). However, when the capacitive load is fully charged, and a negative-going transition of the input signal occurs, both NPN transistors cut off and the PNP transistor conducts to discharge the capacitive load, completing a cycle of operation. All three transistors conduct only during the transitions of the input signal. Provision also is made for the performance of NOR logic and for the generation of a pair of output signals in phase opposition to each other.

BRIEF DESCRIPTION OF THE DRAWING

The sole FIGURE is a schematic diagram of the present invention adapted for the generation of output signals in phase opposition to each other.

DESCRIPTION OF THE PREFERRED EMBODIMENTS

Briefly, NPN transistors 1 and 2, PNP transistor 3, Schottky diode 4 and resistor 5 comprise a high speed, low power driver circuit 14 for driving capacitive load 6 in accordance with the present invention. NPN transistors 7, 8, 9 and 10 and resistors 11, 12 and 13 comprise a multiple input current switch circuit 15 which adds the capabilities of a performing or logic and generating a pair of output signals in phase opposition to each other to the aforementioned driver circuit 14. An additional driver circuit 16, identical to driver circuit 14, is required to drive capacitive load 17 in phase opposition with respect to capacitive load 6. Logic input signals are applied to input teminals 18 and 19 of circuit 15.

In more detail, NPN transistor 2 and PNP transistor 3 comprise an emitter follower series-connected pair of complementary transistors which provide an output signal at terminal 20. Terminal 20 is connected to the junction between the emitters of transistors 2 and 3. Transistor 2 is driven by a signal applied to its base from the collector of transistor 9 of circuit 15. The same signal also is applied to the base of transistor 1. The base of PNP transistor 3 is driven through series-connected transistor 1 and Schottky diode 4. The base of transistor 3 also is connected to negative potential source 21 through resistor 5. The collectors of transistors 1 and 2 are jointly connected to positive potential source 22.

Assuming that capacitive load 6 initially is discharged and a positive-going transition occurs in the voltage applied to the bases of transistors 1 and 2, transistor 2 conducts and charges load 6 accordingly. Although transistor 1 also conducts during the same transition, the resulting drop across forward conducting diode 4 is less than that which is required to turn on transistor 3 so that transistor 3 remains non-conducting. When load 6 has been charged and a negative-going transition occurs in the voltage applied to the bases of transistors 1 and 2, transistors 1 and 2 are cut off with the result that the potential at the base of transistor 3 falls due to the reduction of current through resistor 5. The falling potential at the base of transistor 3, together with the positive potential at the emitter thereof due to charged load 6, rapidly turns on transistor 3 to discharge load 6. Transistors 2 and 3 conduct only during the positive and negative going transitions, respectively, of the voltage applied to their bases. Transistor 1 conducts only during the aforementioned positive-going transition. Thus, very low power is dissipated by driver circuit 14 beyond that which is required to charge and discharge load 6.

PNP transistor 3 is switched into a conduction state to discharge load 6 at the speed at which the potential at the junction of Schottky diode 4 and resistor 5 can be made to fall below the conduction threshold of transistor 3. Such speed is somewhat less than is realized in the case of the aforementioned copending application because resistor 5 draws standby current. Therefore, the value of resistor 5 desirably is large to minimize standby power drain. A large resistor 5, in turn, limits the base current drive of transistor 3, slowing down somewhat the capability of transistor 3 to discharge load capacitance 6, relative to the speed with which the line capacitance is discharged using the more complex high performance PNP using technology of said copending application. However, the slight reduction in speed is offset, from a cost point of view, by eliminating the high performance PNP technology required by said copending application to drive transistor 3.

In any case, the speed with which transistor 3 is actuated in accordance with the present invention is superior to the switching speed of the conventional current switch emitter follower circuit at all power levels normally encountered. As a matter of fact, the speed enhancement realized in accordance with the present invention is even greater at the lower operating power levels which is where very large scale integration (VLSI) is forcing the industry to.

It should be noted that the conductivity types of the transistors and the poling of the diode of driver circuit 14 can be reversed, with appropriate reversal of the biasing voltages, to achieve the same performance advantages using opposite phase input and output signals.

Where logic is desired to be performed, it is preferred to add conventional current switch circuit 15 which provides a positive-going transition at the collector of transistor 9 in the event that either one or both of transistors 7 and 8 receive an input logic signal having a positive-going transition, as is well understood in the art. Transistor 10 and resistor 13 provide a source of constant current to current switch 15 in the known manner. When either or both of transistors 7 and 8 are rendered conductive by positive-going voltage transitions applied to logic input terminals 18 and 19, the aforementioned constant current is steered away from transistor 9, causing the potential to rise at the collector thereof. As is well known, this result is due to the common emitter connection between the emitters of transistors 7, 8 and 9 and the fact that the input voltages at terminals 18 and 19 swing about the ground potential at the base of transistor 9.

An additional advantage accruing to the use of current switch circuit 15 beyond providing for logic capability is that it also produces a voltage at the collectors of transistors 7 and 8 which is opposed in phase relative to the voltage at the collector of transistor 9 which actuates driver circuit 14. Consequently, by the provision of driver circuit 16 connected to the collectors of transistors 7 and 8, the facility is added to drive capacitive load 17 in phase opposition with load 6 and with the same advantages of high speed and low power dissipation previously described relative to circuit 14. Circuit 16 preferably is identical to circuit 14.

The circuit parameter values shown adjacent the respective elements in the Figure are presently preferred for optimum performance and noise margin.

Having thus described my invention, what I claim as new, and desire to secure by Letters Patent is:

1. A complementary emitter follower circuit comprising:
   a series connected first pair of bipolar complementary transistors,
   the emitters of said first pair of transistors being connected together and to an output terminal,
   a series-connected second transistor and Schottky diode,
   the bases of said second transistor and the transistor of said first pair of transistors of like kind being connected together and to an input terminal,
   the terminal of said Schottky diode remote from said second transistor being connected to the base of the other transistor of said first pair of transistors,
   a source of first voltage,
   the collector of said last-named transistor being directly connected to said source of first voltage,
   a resistor,
   the base of said last-named transistor being connected by said resistor to said source of first voltage, and
   a source of second voltage,
   the collectors of said second transistor and of said transistor of like kind being connected to said source of second voltage.

2. A complementary emitter follower circuit comprising:
   a series connected first pair of bipolar complementary transistors,
   the emitters of said first pair of transistors being connected together and to an output terminal,
   a series-connected second NPN transistor and Schottky diode,
   the bases of said second NPN transistor and the NPN transistor of said first pair of transistors being connected together and to an input terminal,
   the anode of said Schottky diode being connected to the base of the PNP transistor of said first pair of transistors,
   a source of negative voltage,
   the collector of said last-named transistor being directly connected to said source of negative voltage,
   a resistor,
   the base of said last-named transistor being connected by said resistor to said source of negative voltage, and
   a source of positive voltage,
   the collectors of said NPN transistors being connected to said source of positive voltage.

3. The circuit defined in claim 2 wherein said output terminal is connected to a capacitive load.

4. The circuit defined in claim 3 and further including
   a multiple input current switch circuit providing a first output in response to a plurality of input logic signals,
   said first output being applied to said input terminal.

5. The circuit defined in claim 4 wherein said current switch circuit also provides a second output in phase opposition with respect to said first output.

6. The circuit defined in claim 5 and further including another circuit identical to the circuit defined in claim 1, said second output being applied to the input terminal of said another circuit.

7. The combination defined in claim 6 wherein the output terminal of said another circuit is connected to a second capacitive load.

* * * * *